United States Patent
Ishida et al.

(10) Patent No.: US 11,845,658 B2
(45) Date of Patent: Dec. 19, 2023

(54) POLYCRYSTALLINE CUBIC BORON NITRIDE AND HEATSINK USING THE SAME

(71) Applicants: SUMITOMO ELECTRIC HARDMETAL CORP., Hyogo (JP); SUMITOMO ELECTRIC INDUSTRIES, LTD., Osaka (JP)

(72) Inventors: Yuh Ishida, Hyogo (JP); Satoru Kukino, Osaka (JP)

(73) Assignees: SUMITOMO ELECTRIC HARDMETAL CORP., Hyogo (JP); Sumitomo Electric Industries, Ltd, Osaka (JP)

( * ) Notice: Subject to any disclaimer, the term of this patent is extended or adjusted under 35 U.S.C. 154(b) by 0 days.

(21) Appl. No.: 17/795,796

(22) PCT Filed: Aug. 2, 2021

(86) PCT No.: PCT/JP2021/028574
§ 371 (c)(1),
(2) Date: Jul. 27, 2022

(87) PCT Pub. No.: WO2023/012857
PCT Pub. Date: Feb. 9, 2023

(65) Prior Publication Data
US 2023/0138294 A1 May 4, 2023

(51) Int. Cl.
*C01B 21/064* (2006.01)
*C09K 5/14* (2006.01)

(52) U.S. Cl.
CPC .............. *C01B 21/064* (2013.01); *C09K 5/14* (2013.01); *C01P 2002/60* (2013.01); *C01P 2002/74* (2013.01); *C01P 2002/76* (2013.01); *C01P 2006/10* (2013.01); *C01P 2006/32* (2013.01); *C01P 2006/80* (2013.01)

(58) Field of Classification Search
CPC .................. C01B 21/064; C09K 5/14
See application file for complete search history.

(56) References Cited

U.S. PATENT DOCUMENTS

2021/0087058 A1  3/2021  Matsukawa et al.

FOREIGN PATENT DOCUMENTS

| JP | S61-117856 A | 6/1986 |
|----|--------------|--------|
| JP | H1-208371 A | 8/1989 |
| JP | H11-246271 A | 9/1999 |
| JP | 2004-250278 A | 9/2004 |
| JP | 2006-021977 A | 1/2006 |
| JP | 2007-145667 A | 6/2007 |
| JP | 2008-094670 A | 4/2008 |
| JP | 2011-140415 A | 7/2011 |
| JP | 2014-034487 A | 2/2014 |
| WO | 2020/175647 A1 | 9/2020 |

*Primary Examiner* — James A Fiorito
(74) *Attorney, Agent, or Firm* — Renner, Otto, Boisselle & Sklar, LLP

(57) ABSTRACT

A polycrystalline cubic boron nitride comprising 99.5% by volume or more of cubic boron nitride, wherein the polycrystalline cubic boron nitride has a heat conductivity of 300 W/mK or more, the polycrystalline cubic boron nitride has a carbon content of 100 ppm or more and 1000 ppm or less in terms of mass, the polycrystalline cubic boron nitride comprises a plurality of crystal grains, and the plurality of crystal grains have a median diameter d50 of an equivalent circle diameter of 0.9 μm or more and 10 μm or less.

9 Claims, No Drawings

POLYCRYSTALLINE CUBIC BORON NITRIDE AND HEATSINK USING THE SAME

TECHNICAL FIELD

The present disclosure relates to a polycrystalline cubic boron nitride and a heatsink using the same.

BACKGROUND ART

Demands for solar power generation, wind power generation, electric cars, and the like have been expanded in order to reduce greenhouse gases as global environmental issues. Power semiconductors are used therefor. Materials for power semiconductors are being shifted from currently major silicon (Si) toward higher-performance silicon carbide (SiC) and gallium nitride (GaN). In such power semiconductors, a technique is adopted in which heat is diffused by using a heatsink.

Cubic boron nitride (hereinafter, also referred to as "cBN".) has a heat conductivity that is second only to diamond. In addition, cubic boron nitride has a heat expansion coefficient close to that of a power semiconductor, and furthermore is an insulating material. Therefore, cubic boron nitride is suitable for a heatsink material. A cBN sintered body obtained by sintering cBN particles with a binder has been conventionally used for a heatsink. However, the binder causes heat conductivity to decrease.

To solve this problem, there has been developed a method in which sintering is conducted while simultaneously directly converting a hexagonal boron nitride into cubic boron nitride at ultrahigh pressure and high temperature without using a binder to obtain a binder-free cubic boron nitride sintered body (Japanese Patent Laying-Open No. 2004-250278 (Patent Literature 1), Japanese Patent Laying-Open No. 11-246271 (Patent Literature 2), Japanese Patent Laying-Open No. 2014-34487 (Patent Literature 3)).

CITATION LIST

Patent Literature

PTL 1: Japanese Patent Laying-Open No. 2004-250278
PTL 2: Japanese Patent Laying-Open No. 11-246271
PTL 3: Japanese Patent Laying-Open No. 2014-34487

SUMMARY OF INVENTION

The present disclosure relates to a polycrystalline cubic boron nitride comprising 99.5% by volume or more of cubic boron nitride, wherein the polycrystalline cubic boron nitride has a heat conductivity of 300 W/mK or more, the polycrystalline cubic boron nitride has a carbon content of 100 ppm or more and 1000 ppm or less in terms of mass, the polycrystalline cubic boron nitride comprises a plurality of crystal grains, and the plurality of crystal grains have a median diameter d50 of an equivalent circle diameter of 0.9 μm or more and 10 μm or less.

The present disclosure relates to a heatsink using the above polycrystalline cubic boron nitride.

DETAILED DESCRIPTION

Problem to be Solved by the Present Disclosure

A heatsink having high heat conductivity and high transverse rupture strength is demanded from the viewpoint of an increase in life of a power semiconductor.

Accordingly, an object of the present disclosure is to provide a polycrystalline cubic boron nitride that can enhance heat conductivity and transverse rupture strength of a heatsink when used as a material of the heatsink.

Advantageous Effect of the Present Disclosure

According to the present disclosure, it is possible to provide a polycrystalline cubic boron nitride having high heat conductivity and high transverse rupture strength, and a heatsink having high heat conductivity and high transverse rupture strength.

Description of Embodiments

First, the embodiments of the present disclosure will be listed and described.

(1) The present disclosure relates to a polycrystalline cubic boron nitride comprising 99.5% by volume or more of cubic boron nitride, wherein the polycrystalline cubic boron nitride has a heat conductivity of 300 W/mK or more, the polycrystalline cubic boron nitride has a carbon content of 100 ppm or more and 1000 ppm or less in terms of mass, the polycrystalline cubic boron nitride comprises a plurality of crystal grains, and the plurality of crystal grains have a median diameter d50 of an equivalent circle diameter of 0.9 μm or more and 10 μm or less.

The polycrystalline cubic boron nitride of the present disclosure has high heat conductivity and high transverse rupture strength.

(2) The cubic boron nitride preferably has a dislocation density of $4.5 \times 10^{15}/m^2$ or less. By having such a dislocation density, the polycrystalline cubic boron nitride has much higher heat conductivity.

(3) The polycrystalline cubic boron nitride preferably has an oxygen content of 700 ppm or less in terms of mass. By having such an oxygen content, the polycrystalline cubic boron nitride has higher heat conductivity and transverse rupture strength.

(4) It is preferable that the polycrystalline cubic boron nitride has a total content of an alkali metal element and an alkaline earth metal element of 10 ppm or less in terms of mass. By having such a total content, the polycrystalline cubic boron nitride has higher heat conductivity and transverse rupture strength.

(5) The polycrystalline cubic boron nitride preferably has a heat conductivity of 500 W/mK or more. By having such a heat conductivity, the polycrystalline cubic boron nitride has much higher heat conductivity.

(6) In an X-ray diffraction spectrum of the polycrystalline cubic boron nitride, a ratio of an X-ray diffraction intensity I (220) of the (220) plane to an X-ray diffraction intensity I (111) of the (111) plane, I (220)/I (111), is preferably 0.10 or more and 0.30 or less. According to this, anisotropy of heat conduction and heat expansion in the polycrystalline cubic boron nitride is decreased. Therefore, when the polycrystalline cubic boron nitride is used in a heatsink, the life of the heatsink, relative to a heat cycle, is elongated.

(7) It is preferable that the dislocation density be calculated by using a modified Williamson-Hall method and a modified Warren-Averbach method.

(8) It is preferable that the dislocation density be measured using synchrotron radiation as an X-ray source.

(9) The present disclosure relates to a heatsink using the above polycrystalline cubic boron nitride. The heatsink of the present disclosure has high heat conductivity and high transverse rupture strength.

Details of Embodiments of Present Disclosure

Specific examples of the polycrystalline cubic boron nitride and the heatsink of the present disclosure will be described below.

In the present specification, the designation "A to B" means to include the upper limit and the lower limit of a range (namely, A or more and B or less), and when no unit is designated with A and any unit is designated with only B, the unit of A and the unit of B are the same as each other.

First Embodiment: Polycrystalline Cubic Boron Nitride

One embodiment of the present disclosure (hereinafter, also referred to as "the present embodiment".) relates to a polycrystalline cubic boron nitride including 99.5% by volume or more of cubic boron nitride, wherein the polycrystalline cubic boron nitride has a heat conductivity of 300 W/mK or more, the polycrystalline cubic boron nitride has a carbon content of 100 ppm or more and 1000 ppm or less in terms of mass, the polycrystalline cubic boron nitride includes a plurality of crystal grains, and the plurality of crystal grains have a median diameter d50 of an equivalent circle diameter of 0.9 μm or more and 10 μm or less.

The polycrystalline cubic boron nitride of the present disclosure is a sintered body, but since it is often intended that a sintered body include a binder, the term "polycrystalline" is used in the present disclosure.

A polycrystalline cubic boron nitride of the present embodiment can have not only high heat conductivity, but also high transverse rupture strength. The reason for this is presumed to be as described in the following (i) to (iii).

(i) The polycrystalline cubic boron nitride of the present embodiment includes 99.5% by volume or more of a cubic boron nitride having high heat conductivity. Therefore, the polycrystalline cubic boron nitride can also have high heat conductivity.

(ii) The polycrystalline cubic boron nitride of the present embodiment has a carbon content of 100 ppm or more and 1000 ppm or less in terms of mass. Carbon is incorporated into cubic boron nitride particles (hereinafter, also referred to as "cBN particles".) in the polycrystalline cubic boron nitride. Specifically, the carbon is present between crystal lattices of cubic boron nitride, or is present with being substituted with boron or nitrogen of cubic boron nitride, and some thereof is present as a B—C—N compound presumed as carbonnitride of B, such as $BC_2N$ or BCN, or as diamond. It is presumed that formation of an oxide inhibiting bonding between cBN particles is thus suppressed. Therefore, the bonding force between cBN particles is increased, and the polycrystalline cubic boron nitride can have high heat conductivity and high transverse rupture strength.

(iii) The plurality of crystal grains included in the polycrystalline cubic boron nitride of the present embodiment have a median diameter d50 of an equivalent circle diameter of 0.9 μm or more and 10 μm or less. As the grain size of the crystal grains increases, heat conductivity tends to be higher. Therefore, the polycrystalline cubic boron nitride can have high heat conductivity.

<Composition>

The polycrystalline cubic boron nitride of the present embodiment includes 99.5% by volume or more of cubic boron nitride. As a result, the polycrystalline cubic boron nitride can have high heat conductivity.

The cubic boron nitride content in the polycrystalline cubic boron nitride is 99.5% by volume or more, preferably 99.6% by volume or more, more preferably 99.8% by volume or more, further preferably 99.9% by volume or more, and most preferably 100% by volume. The cubic boron nitride content in the polycrystalline cubic boron nitride is preferably 99.5% by volume or more and 100% by volume or less, preferably 99.6% by volume or more and 100% by volume or less, more preferably 99.8% by volume or more and 100% by volume or less, further preferably 99.9% by volume or more and 100% by volume or less, and most preferably 100% by volume.

The polycrystalline cubic boron nitride of the present embodiment may include, in addition to cubic boron nitride, one, two or all of hexagonal boron nitride, compressed hexagonal boron nitride and wurtzite boron nitride, within a range in which the effects of the present embodiment are exhibited. In this case, the total content of hexagonal boron nitride, compressed hexagonal boron nitride and wurtzite boron nitride in the polycrystalline cubic boron nitride can be 0.5% by volume or less. Here, the term "compressed hexagonal boron nitride" refers to a substance having a crystal structure similar to that of ordinary hexagonal boron nitride, in which the interplanar spacing in the c-axis direction is smaller than that of ordinary hexagonal boron nitride (0.333 nm).

The total content of hexagonal boron nitride, compressed hexagonal boron nitride and wurtzite boron nitride in the polycrystalline cubic boron nitride is preferably 0% by volume or more and 0.5% by volume or less, preferably 0% by volume or more and 0.4% by volume or less, more preferably 0% by volume or more and 0.2% by volume or less, further preferably 0% by volume or more and 0.1% by volume or less, and most preferably 0% by volume. That is, it is most preferable that the polycrystalline cubic boron nitride does not include any of hexagonal boron nitride, compressed hexagonal boron nitride and wurtzite boron nitride.

The hexagonal boron nitride content in the polycrystalline cubic boron nitride is preferably 0% by volume or more and 0.5% by volume or less, preferably 0% by volume or more and 0.4% by volume or less, more preferably 0% by volume or more and 0.2% by volume or less, further preferably 0% by volume or more and 0.1% by volume or less, and most preferably 0% by volume. That is, it is most preferable that the polycrystalline cubic boron nitride does not include any of hexagonal boron nitride.

The compressed hexagonal boron nitride content in the polycrystalline cubic boron nitride is preferably 0% by volume or more and 0.5% by volume or less, preferably 0% by volume or more and 0.4% by volume or less, more preferably 0% by volume or more and 0.2% by volume or less, further preferably 0% by volume or more and 0.1% by volume or less, and most preferably 0% by volume. That is, it is most preferable that the polycrystalline cubic boron nitride does not include any of compressed hexagonal boron nitride.

The wurtzite boron nitride content in the polycrystalline cubic boron nitride is preferably 0% by volume or more and 0.5% by volume or less, preferably 0% by volume or more and 0.4% by volume or less, more preferably 0% by volume or more and 0.2% by volume or less, further preferably 0% by volume or more and 0.1% by volume or less, and most preferably 0% by volume. That is, it is most preferable that the polycrystalline cubic boron nitride does not include any of wurtzite boron nitride.

The content (% by volume) of the cubic boron nitride, hexagonal boron nitride, compressed hexagonal boron nitride, and wurtzite boron nitride in the polycrystalline cubic boron nitride can be measured by an X-ray diffraction method. The specific measurement method is as follows.

The polycrystalline cubic boron nitride is cut with a diamond grindstone-electrodeposited wire, and the cut surface is used as an observation surface. Using an X-ray diffractometer ("MiniFlex 600" (trade name) manufactured by Rigaku), the X-ray diffraction spectrum of a cut surface of the polycrystalline cubic boron nitride is obtained. The conditions of the X-ray diffractometer at this time are as follows.

Characteristic X-ray: Cu-Kα (wavelength 1.54 Å)
Tube voltage: 45 kV
Tube current: 40 mA
Filter: Multi-layer mirror
Optical system: Focused method
X-ray diffraction method: θ-2θ method.

In the obtained X-ray diffraction spectrum, the following peak intensity A, peak intensity B, peak intensity C, and peak intensity D are measured.

Peak intensity A: Peak intensity of compressed hexagonal boron nitride excluding the background from the peak intensity near the diffraction angle 2θ=28.5°.

Peak intensity B: Peak intensity of wurtzite boron nitride excluding the background from the peak intensity near the diffraction angle 2θ=40.8°.

Peak intensity C: Peak intensity of cubic boron nitride excluding the background from the peak intensity near the diffraction angle 2θ=43.5°.

Peak intensity D: Peak intensity of hexagonal boron nitride excluding the background from the peak intensity near the diffraction angle 2θ=26.8°.

The compressed hexagonal boron nitride content is obtained by calculating the value of peak intensity A/(peak intensity A+peak intensity B+peak intensity C+peak intensity D). The wurtzite boron nitride content is obtained by calculating the value of peak intensity B/(peak intensity A+peak intensity B+peak intensity C+peak intensity D). The cubic boron nitride content is obtained by calculating the value of peak intensity C/(peak intensity A+peak intensity B+peak intensity C+peak intensity D). The hexagonal boron nitride content is obtained by calculating the value of peak intensity D/(peak intensity A+peak intensity B+peak intensity C+peak intensity D).

Since compressed hexagonal boron nitride, wurtzite boron nitride, cubic boron nitride and hexagonal boron nitride all have similar electron density, the above-described X-ray peak intensity ratio can be taken as the volume ratio in the polycrystalline cubic boron nitride.

<<Carbon Content>>

The polycrystalline cubic boron nitride of the present embodiment has a carbon content of 100 ppm or more and 1000 ppm or less in terms of mass. According to this, the bonding force between cBN particles is increased, and the polycrystalline cubic boron nitride can have high heat conductivity and high transverse rupture strength.

The lower limit of the carbon content in the polycrystalline cubic boron nitride is preferably 100 ppm or more, more preferably 200 ppm or more, and further preferably 300 ppm or more in terms of mass. The upper limit of the carbon content in the polycrystalline cubic boron nitride is preferably 1000 ppm or less, more preferably 900 ppm or less, and further preferably 800 ppm or less in terms of mass. The carbon content in the polycrystalline cubic boron nitride is 100 ppm or more and 1000 ppm or less, preferably 200 ppm or more and 900 ppm or less, and more preferably 300 ppm or more and 800 ppm or less in terms of mass.

The carbon content in the polycrystalline cubic boron nitride is measured by secondary ion mass spectrometry (SIMS). The carbon content is measured by, for example, using "CAMECA IMS-7f" (manufactured by Ametek, Inc.) as equipment, and a primary ion species Cs$^+$ at a primary acceleration voltage of 15.0 kV in a detection region of φ30 μm. The oxygen content in the polycrystalline cubic boron nitride, and the contents of an alkali metal element and an alkaline earth metal element, and other unavoidable impurities, described below, are also measured in the same manner.

<<Oxygen Content>>

The polycrystalline cubic boron nitride of the present embodiment preferably has an oxygen content of 700 ppm or less in terms of mass. According to this, the polycrystalline cubic boron nitride has higher hardness, strength, heat conductivity and transverse rupture strength. The reason for this is presumed to be as described below.

The polycrystalline cubic boron nitride of the present embodiment is obtained by heating and pressurizing raw material hexagonal boron nitride and resulting in phase transition through wurtzite boron nitride to cubic boron nitride. When oxygen is present in the raw material hexagonal boron nitride, the oxygen tends to inhibit the phase transition. When the oxygen content in the polycrystalline cubic boron nitride is as low as 700 ppm or less in terms of mass, inhibition of the above phase transition hardly occurs and the conversion rate from hexagonal boron nitride to cubic boron nitride is increased. Therefore, it is presumed that the obtained polycrystalline cubic boron nitride has a high cubic boron nitride content and the polycrystalline cubic boron nitride has a higher heat conductivity.

When oxygen is present in the grain boundaries of cubic boron nitride particles in the polycrystalline cubic boron nitride, the bonding force between the particles tends to be decreased. When the oxygen content in the polycrystalline cubic boron nitride is as low as 700 ppm or less, it is presumed that the bonding force between cubic boron nitride particles is inhibited from being decreased and the polycrystalline cubic boron nitride has higher hardness, strength, heat conductivity and transverse rupture strength.

The upper limit of the oxygen content in the polycrystalline cubic boron nitride is preferably 700 ppm or less, preferably 500 ppm or less, and more preferably 300 ppm or less in terms of mass. A lower oxygen content in the polycrystalline cubic boron nitride is more preferable. Therefore, the lower limit of the oxygen content in the polycrystalline cubic boron nitride is preferably 0 ppm or more. The oxygen content in the polycrystalline cubic boron nitride is preferably 0 ppm or more and 700 ppm or less, more preferably 0 ppm or more and 500 ppm or less, and further preferably 0 ppm or more and 300 ppm or less.

<<Total Content of Alkali Metal Elements and Alkaline Earth Metal Elements>>

The total content of alkali metal elements and alkaline earth metal elements in the polycrystalline cubic boron nitride is preferably 10 ppm or less in terms of mass. The alkali metal elements include lithium (Li), sodium (Na), and potassium (K). The alkaline earth metal elements include calcium (Ca), magnesium (Mg), strontium (Sr), and barium (Ba)). According to this, the polycrystalline cubic boron nitride has higher hardness, strength, heat conductivity and transverse rupture strength. The reason for this is presumed to be as described below.

The alkali metal elements and the alkaline earth metal elements tend to decrease the bonding force between cubic boron nitride particles. It is presumed that, when the total content of alkali metal elements and alkaline earth metal elements in the polycrystalline cubic boron nitride is 10 ppm or less in terms of mass, the bonding force between cubic boron nitride particles is inhibited from being decreased and the polycrystalline cubic boron nitride has higher hardness, strength, heat conductivity and transverse rupture strength.

The upper limit of the total content of alkali metal elements and alkaline earth metal elements in the polycrystalline cubic boron nitride is preferably 10 ppm or less, more preferably 5 ppm or less, and further preferably 3 ppm or less in terms of mass. The total content of alkali metal elements and alkaline earth metal elements in the polycrystalline cubic boron nitride is preferably lower. Therefore, the lower limit of the total content of alkali metal elements and alkaline earth metal elements in the polycrystalline cubic boron nitride is preferably 0 ppm or more in terms of mass. The total content of alkali metal elements and alkaline earth metal elements in the polycrystalline cubic boron nitride is preferably 0 ppm or more and 10 ppm or less, more preferably 0 ppm or more and 5 ppm or less, further preferably 0 ppm or more and 3 ppm or less in terms of mass.

<<Unavoidable Impurities>>

The polycrystalline cubic boron nitride may include unavoidable impurities within a range in which the effects of the present disclosure are exhibited. Examples of unavoidable impurities include hydrogen, silicon (Si), and aluminum (Al). The content of the unavoidable impurities in the polycrystalline cubic boron nitride is preferably 0% by mass or more and 0.1% by mass or less.

<Dislocation Density>

In the present embodiment, the cubic boron nitride preferably has a dislocation density of $4.5 \times 10^{15}/m^2$ or less. By having such a dislocation density, the polycrystalline cubic boron nitride has a higher heat conductivity.

The upper limit of the dislocation density of the cubic boron nitride is preferably $4.5 \times 10^{15}/m^2$ or less, more preferably $4.0 \times 10^{15}/m^2$ or less, and further preferably $3.5 \times 10^{15}/m^2$ or less. Although the lower limit of the dislocation density of the cubic boron nitride is not particularly limited, from a production viewpoint, it can be set to $1 \times 10^{15}/m^2$ or more. The dislocation density of the cubic boron nitride is preferably $1 \times 10^{15}/m^2$ or more and $4.5 \times 10^{15}/m^2$ or less, more preferably $1 \times 10^{15}/m^2$ or more and $4.0 \times 10^{15}/m^2$ or less, and further preferably $1 \times 10^{15}/m^2$ or more and $3.5 \times 10^{15}/m^2$ or less.

In the present specification, the dislocation density of the cubic boron nitride is calculated by the following procedure. A test piece composed of the polycrystalline cubic boron nitride is provided. In terms of size, the test piece has an observation surface of 2.0 mm×2.0 mm and a thickness of 1.0 mm. The observation surface of the test piece is polished by a diamond grindstone.

X-ray diffraction measurement is performed on the observation surface of the test piece under the following conditions, and a line profile of a diffraction peak from each orientation plane of cubic boron nitride's major orientations which are (111), (200), (220), (311), (400) and (331) is obtained.

(X-Ray Diffraction Measurement Conditions)

X-ray source: synchrotron radiation

Condition for equipment: detector NaI (fluorescence is cut by an appropriate ROI)

Energy: 18 keV (wavelength: 0.6888 Å)

Spectroscopic crystal: Si (111)

Entrance slit: width 5 mm×height 0.5 mm

Light receiving slit: double slit (width 3 mm×height 0.5 mm)

Mirror: platinum coated mirror

Incident angle: 2.5 mrad

Scanning method: 2θ-θ scan

Measurement peaks: six peaks from cubic boron nitride's (111), (200), (220), (311), (400), and (331). When it is difficult to obtain a profile depending on texture and orientation, the peak for that Miller index is excluded.

Measurement conditions: there are 9 or more measurement points set in the full width at half maximum. Peak top intensity is set to 2000 counts or more. Peak tail is also used in the analysis, and accordingly, the measurement range is set to about 10 times the full width at half maximum.

A line profile obtained from the above X-ray diffraction measurement will be a profile including both a true broadening attributed to a physical quantity such as the sample's inhomogeneous strain and a broadening attributed to the equipment. In order to determine inhomogeneous strain and crystallite size, a component attributed to the equipment is removed from the measured line profile to obtain a true line profile. The true line profile is obtained by fitting the obtained line profile and the line profile that is attributed to the equipment by a pseudo Voigt function, and subtracting the line profile attributed to the equipment. $LaB_6$ is used as a standard sample for removing a broadening of a diffracted peak attributed to the equipment. When significantly collimated radiation is used, a broadening of a diffracted peak attributed to the equipment may be regarded as zero.

The obtained true line profile is analyzed using the modified Williamson-Hall method and the modified Warren-Averbach method to calculate dislocation density. The modified Williamson-Hall method and the modified Warren-Averbach method are known line profile analysis methods used for determining dislocation density.

The modified Williamson-Hall method's expression is represented by the following expression (I).

[Expression 1]

[Expression 1]

$$\Delta K = \frac{0.9}{D} + \left(\frac{\pi M^2 b^2}{2}\right)^{1/2} \rho^{1/2} K C^{1/2} + O(K^2 C) \quad (I)$$

where ΔK represents a full width at half maximum of a line profile, D represents a crystallite size, M represents a dislocation arrangement parameter, b represents a Burgers vector, ρ represents the dislocation density, K represents a scattering vector, O (K²C) represents a higher-order term of K²C, and C represents an average contrast factor.

C in the above expression (I) is represented by the following expression (II).

$$C=C_{h00}[1-q(h^2k^2+h^2l^2+k^2l^2)/(h^2+k^2+l^2)^2] \quad (II)$$

In the above expression (II), a contrast factor $C_{h00}$ for screw dislocation and that for edge dislocation and a coefficient q for each contrast factor are obtained by using the computing code ANIZC, with a slip system of <110>{111}, and elastic stiffness $C_{11}$, $C_{12}$ and $C_{44}$ of 8.44 GPa, 1.9 GPa, and 4.83 GPa, respectively. Contrast factor $C_{h00}$ is 0.203 for screw dislocation and 0.212 for edge dislocation. The coefficient q for the contrast factor is 1.65 for screw dislocation and 0.58 for edge dislocation. Note that screw dislocation's ratio is fixed to 0.5 and edge dislocation's ratio is fixed to 0.5.

Furthermore, between dislocation and inhomogeneous strain, a relationship represented by an expression (III) is established using contrast factor C, as below:

$$<\varepsilon(L)^2>=(\rho Cb^2/4\pi)\ln(R_e/L) \quad (III)$$

where $R_e$ represents dislocation's effective radius.

By the relationship of the above expression (III) and the Warren-Averbach expression, the following expression (IV) can be presented, and as the modified Warren-Averbach method, dislocation density ρ and a crystallite size can be determined.

$$\ln A(L)=\ln A^S(L)-(\pi L^2 \rho b^2/2)\ln(R_e/L)(K^2C)+O(K^2C)^2 \quad (IV)$$

where A(L) represents a Fourier series, $A^S(L)$ represents a Fourier series for a crystallite size, and L represents a Fourier length.

For details of the modified Williamson-Hall method and the modified Warren-Averbach method, see T. Ungar and A. Borbely, "The effect of dislocation contrast on x-ray line broadening: A new approach to line profile analysis," Appl. Phys. Lett., vol. 69, no. 21, p. 3173, 1996, and T. Ungar, S. Ott, P. Sanders, A. Borbely, J. Weertman, "Dislocations, grain size and planar faults in nanostructured copper determined by high resolution X-ray diffraction and a new procedure of peak profile analysis," Acta Mater., vol. 46, no. 10, pp. 3693-3699, 1998.

<Heat Conductivity>

The lower limit of the heat conductivity of the polycrystalline cubic boron nitride of the present embodiment is 300 W/mK or more, preferably 500 W/mK or more, and more preferably 600 W/mK or more. Although the upper limit of the heat conductivity of the polycrystalline cubic boron nitride is not particularly limited, it can be set to, for example, 2000 W/mK or less. The heat conductivity of the polycrystalline cubic boron nitride is preferably 300 W/mK or more and 2000 W/mK or less, more preferably 500 W/mK or more and 2000 W/mK or less, and further preferably 600 W/mK or more and 2000 W/mK or less.

In the present specification, the heat conductivity of the polycrystalline cubic boron nitride is obtained by measuring thermal diffusivity by a laser flash method using a xenon flash lamp, and converting the thermal diffusivity into the heat conductivity. The measurement temperature is 25° C. "LFA467 Hyper Flash"™ manufactured by NETZSCH Japan can be used for the measurement equipment. The following conditions (a) to (c) are adopted in the above conversion.

(a) Heat conductivity=thermal diffusivity×specific heat× density (b) Cubic boron nitride has a density of 3.45 g/cm³ and a specific heat of 0.6 J/mol (c) The cubic boron nitride content in the polycrystalline cubic boron nitride is assumed to be 100% by volume.

<Ratio I (220)/I (111) in X-Ray Diffraction Spectrum>

In an X-ray diffraction spectrum of the polycrystalline cubic boron nitride of the present embodiment, the ratio of X-ray diffraction intensity I (220) of the (220) plane to X-ray diffraction intensity I (111) of the (111) plane, I (220)/I (111) is preferably 0.10 or more and 0.30 or less. According to this, the polycrystalline cubic boron nitride is isotropic, and anisotropy of heat conduction and heat expansion in the polycrystalline cubic boron nitride is decreased. Therefore, when the polycrystalline cubic boron nitride is used in a heatsink, the life of the heatsink, relative to a heat cycle, is elongated.

The lower limit of ratio I (220)/I (111) above is preferably 0.10 or more, more preferably 0.15 or more, and further preferably 0.18 or more. The upper limit of ratio I (220)/I (111) above is preferably 0.30 or less, more preferably 0.28 or less, and further preferably 0.25 or less. Ratio I (220)/I (111) above is preferably 0.10 or more and 0.30 or less, more preferably 0.15 or more and 0.28 or less, and further preferably 0.18 or more and 0.25 or less.

In the present specification, ratio I (220)/I (111) above is measured by the following procedure. The polycrystalline cubic boron nitride is cut with a diamond grindstone-electrodeposited wire, and the cut surface is used as an observation surface. Using an X-ray diffractometer ("MiniFlex 600" (trade name) manufactured by Rigaku), the X-ray diffraction spectrum of a cut surface of the polycrystalline cubic boron nitride is obtained. The conditions of the X-ray diffractometer at this time are as follows.

Characteristic X-ray: Cu-Kα (wavelength 1.54 Å)
Tube voltage: 45 kV
Tube current: 40 mA
Filter: Multi-layer mirror
Optical system: Focused method
X-ray diffraction method: θ- 2θ method Ratio I (220)/I (111) of X-ray diffraction intensity I (220) of the (220) plane to X-ray diffraction intensity I (111) of the (111) plane is determined based on the X-ray diffraction spectrum obtained.

<Average Grain Size of Crystal Grains>

The polycrystalline cubic boron nitride of the present embodiment includes a plurality of crystal grains, and the median diameter d50 of an equivalent circle diameter of the plurality of crystal grains (hereinafter, also referred to as "d50".) is 0.9 μm or more and 10 μm or less. In the present specification, the median diameter d50 of an equivalent circle diameter of the plurality of crystal grains means an equivalent circle diameter at a cumulative number of crystal grains of 50%. According to this, the polycrystalline cubic boron nitride has a higher heat conductivity.

The lower limit of the d50 of an equivalent circle diameter of the plurality of crystal grains is preferably 0.9 μm or more, more preferably 2.0 μm or more, and further preferably 3.0 μm or more. The upper limit of the d50 of an equivalent circle diameter of the plurality of crystal grains is preferably 10 μm or less from a production viewpoint. The d50 of an equivalent circle diameter of the plurality of crystal grains is 0.9 μm or more and 10 μm or less, preferably 2.0 μm or more and 10 μm or less, and more preferably 3.0 μm or more and 10 μm or less.

The d90 of an equivalent circle diameter of the plurality of crystal grains (hereinafter, also referred to as "d90".) is preferably 1.0 μm or more and 15 μm or less. In the present specification, the d90 of an equivalent circle diameter of the plurality of crystal grains means an equivalent circle diameter at a cumulative number of crystal grains of 90%. According to this, the polycrystalline cubic boron nitride has a higher heat conductivity.

The lower limit of the d90 of an equivalent circle diameter of the plurality of crystal grains is preferably 1.0 μm or more, more preferably 3.0 μm or more, and further preferably 4.0 μm or more. The upper limit of the d90 of an equivalent circle diameter of the plurality of crystal grains is preferably 15 μm or less from a production viewpoint. The d90 of an equivalent circle diameter of the plurality of crystal grains is preferably 1.0 μm or more and 15 μm or less, more preferably 3.0 μm or more and 15 μm or less, and further preferably 4.0 μm or more and 15 μm or less.

In the present specification, the d50 and d90 of equivalent circle diameters of the plurality of crystal grains included in the polycrystalline cubic boron nitride are measured by the following procedure.

The polycrystalline cubic boron nitride is cut with a diamond grindstone-electrodeposited wire or the like, and the cut surface is polished. The polished surface is observed using a SEM ("JSM-7500F"™ manufactured by JEOL Ltd.) to obtain SEM images. The size of the measurement visual field size is 12 μm×15 μm, and the observation magnification is 10,000 times. Five locations as these measurement visual fields are arbitrarily set.

For each of the SEM images of such five measurement visual fields, in a state in which the grain boundaries of the crystal grains observed in the measurement visual field are isolated, the distribution of the equivalent circle diameters of the crystal grains is measured using image processing software (Win Roof ver. 7.4.5).

In each of the measurement visual fields, the d50 of an equivalent circle diameter of the crystal grains is determined with the number of the crystal grains in the entire of such each measurement visual field, as the denominator, based on the above distribution of the equivalent circle diameters of the crystal grains. In each of the five measurement visual fields, each d50 of an equivalent circle diameter of the crystal grains is determined and the average value thereof is calculated. The average value corresponds to the d50 of an equivalent circle diameter of the plurality of crystal grains included in the polycrystalline cubic boron nitride.

In each of the measurement visual fields, the d90 of an equivalent circle diameter of the crystal grains is determined with the number of the crystal grains in the entire of such each measurement visual field, as the denominator, based on the above distribution of the equivalent circle diameters of the crystal grains. In each of the five measurement visual fields, each d90 of an equivalent circle diameter of the crystal grains is determined and the average value thereof is calculated. The average value corresponds to the d90 of an equivalent circle diameter of the plurality of crystal grains included in the polycrystalline cubic boron nitride.

To the extent measured by the applicant, it was confirmed that as long as the median diameters d50 and d90 are measured in the same sample, even the calculation is performed a plurality of times by changing the selected locations for the measurement visual field in the polycrystalline cubic boron nitride, there was almost no variation in the measurement results and there was no arbitrariness even when the measurement visual field was randomly set.

<Method for Manufacturing Polycrystalline Cubic Boron Nitride>

The polycrystalline cubic boron nitride of the present embodiment can be produced by, for example, the following method.

<<Raw Material Provision Step>>

A hexagonal boron nitride powder is provided as a raw material. The hexagonal boron nitride powder has a graphite content of 50 to 1000 ppm in terms of mass, and a total content of alkali metal elements and alkaline earth metal elements of 10 ppm or less in terms of mass. The hexagonal boron nitride powder has a median diameter d50 of an equivalent circle diameter of 5 μm. The hexagonal boron nitride powder is placed into a carbon crucible, and is heat treated in a nitrogen atmosphere (pressure 0.1 MPa) at a temperature of 2100° C. for 10 to 120 minutes. Thus, carbon as a raw material of the crucible is partially transferred to the hexagonal boron nitride powder. Oxygen included as an impurity in the hexagonal boron nitride powder can also be decreased. It has been considered that carbon has been an impurity in a conventional method for manufacturing polycrystalline cubic boron nitride. Therefore, there has not any technical idea for inclusion of carbon in a raw material in such a manufacturing method, and no those skilled in the art have adopted use of a carbon crucible. Such inclusion of carbon in a raw material by use of a carbon crucible in heat treating of a hexagonal boron nitride powder is a solution newly found by the present inventors.

<<Sintering Step>>

Next, the hexagonal boron nitride powder heat treated is enclosed in a molybdenum capsule, the hexagonal boron nitride powder is heated and pressurized to a temperature of 2500 to 2700° C. and a pressure of 10 GPa or more by using a six-way pressure multi-anvil high pressure generator or an eight-way pressure Kawai-type multi-anvil high pressure generator, and a cubic boron nitride sintered body is obtained. The temperature and the pressure are adjusted during the heating and pressurizing so that a heating and pressurizing path passes through a temperature and a pressure in a stable region of wurtzite boron nitride and the entry temperature into the stable region of wurtzite boron nitride is 800° C. or more. The stable region of wurtzite boron nitride is, when the temperature is represented as T (° C.) and the pressure as P (GPa), a region that simultaneously satisfies the following Formula 1 and Formula 2.

$P \geq -0.0037T + 11.301$     Formula 1:

$P \leq -0.085T + 117$     Formula 2:

According to the above heating and pressurizing path, the hexagonal boron nitride powder is converted into wurtzite boron nitride in an environment where atomic diffusion easily occurs, and is then converted into cubic boron nitride. Therefore, the obtained polycrystalline cubic boron nitride has lattice defects decreased, a lowered dislocation density of the cubic boron nitride, and a higher heat conductivity.

The holding time at a temperature of 2500 to 2700° C. and a pressure of 10 GPa or more as described above is preferably 10 minutes or more and 30 minutes or less. According to this, the dislocation density of the cubic boron nitride is further lowered, and the size of cubic boron nitride particles is increased and the polycrystalline cubic boron nitride has a higher heat conductivity.

Second Embodiment: Heatsink

A heatsink of the present embodiment is a heatsink using the above polycrystalline cubic boron nitride of the first embodiment. The heatsink of the present embodiment has not only high heat conductivity, but also high transverse rupture strength. Therefore, the heatsink can inhibit heat conductivity from being decreased with use, and can allow for an increase in semiconductor life.

[Note 1]

It is preferable that the polycrystalline cubic boron nitride of the present disclosure includes 99.5% by volume or more and 100% by volume or less of cubic boron nitride and a total of 0% by volume or more and 0.5% by volume or less of hexagonal boron nitride, compressed hexagonal boron nitride and wurtzite boron nitride, wherein the polycrystalline cubic boron nitride has a carbon content of 100 ppm or more and 1000 ppm or less in terms of mass.

[Note 2]

It is preferable that the polycrystalline cubic boron nitride of the present disclosure includes 99.5% by volume or more and 100% by volume or less of cubic boron nitride and a total of 0% by volume or more and 0.5% by volume or less of hexagonal boron nitride, compressed hexagonal boron nitride and wurtzite boron nitride, wherein the polycrystalline cubic boron nitride has a carbon content of 100 ppm or more and 1000 ppm or less in terms of mass, and the polycrystalline cubic boron nitride has an oxygen content of 0 ppm or more and 700 ppm or less in terms of mass.

EXAMPLES

The embodiments will now be described more specifically by way of Examples. However, the present invention is not limited to these Examples.

[Production of Polycrystalline Cubic Boron Nitride]

<<Raw Material Provision Step>>

A hexagonal boron nitride powder was provided as a raw material of a polycrystalline cubic boron nitride as each Sample. Each hexagonal boron nitride powder used in Sample 1 to Sample 4, Sample 6, Sample 7 and Sample 9 to Sample 12 had a graphite content of 50 ppm in terms of mass, a total content of alkali metal elements and alkaline earth metal elements of 10 ppm or less in terms of mass, and a median diameter d50 of an equivalent circle diameter of 5 μm. Each hexagonal boron nitride powder used in Sample 5 and Sample 8 had a graphite content of 50 ppm in terms of mass, a total content of alkali metal elements and alkaline earth metal elements of more than 10 ppm in terms of mass, and a median diameter d50 of an equivalent circle diameter of 5 μm.

Each of the above hexagonal boron nitride powders was placed into a carbon crucible, and was heat treated at a temperature of 2100° C. in a nitrogen atmosphere (pressure 0.1 MPa). The heat treating time was as described in the "time (minutes)" column of the "raw material provision step" in Table 1. For example, Sample 1 was heat treated at 2100° C. for 10 minutes.

<<Sintering Step>>

Next, such each hexagonal boron nitride powder heat treated was enclosed in a molybdenum capsule, such each hexagonal boron nitride powder was heated and pressurized by using a high pressure generator, and a polycrystalline cubic boron nitride of each Sample was obtained. A six-way pressure multi-anvil high pressure generator was used for Sample 1 to Sample 10 and Sample 12. A belt type high pressure generator was used for Sample 11. The heating and pressurizing was performed at multiple stages from the "starting point" to the "first stage", "second stage", "third stage" and "fourth stage" as shown in the "sintering step" in Table 1. The designation "–" in the "first stage", "second stage", "third stage" and "fourth stage" columns in Table 1 shows no heating and pressurizing performed at the relevant stage. The holding time at the final stage is shown in the "holding time at final stage" column in Table 1. The "holding time at final stage" here means the holding time at a pressure and a temperature finally attained in the sintering step.

For example, Sample 1 was heated and pressurized at 25° C. and 0 GPa at the starting point, heated to 1000° C. with being maintained at 0 GPa at the first stage, pressurized to 10 GPa with being maintained at 1000° C. at the second stage, heated to 2600° C. with being maintained at 10 Ga at the third stage, and held at the pressure (10 GPa) and the temperature (2600° C.) attained at the third stage, for 20 minutes.

TABLE 1

| | Raw material provision step | | Sintering step | | | | | | | | | |
|---|---|---|---|---|---|---|---|---|---|---|---|---|
| | | | Starting point | | First stage | | Second stage | | Third stage | | Fourth stage | | Holding time at |
| Sample No. | Temperature (° C.) | Time (minutes) | Temperature (° C.) | Pressure (GPa) | Temperature (° C.) | Pressure (GPa) | Temperature (° C.) | Pressure (GPa) | Temperature (° C.) | Pressure (GPa) | Temperature (° C.) | Pressure (GPa) | final stage (minutes) |
| 1 | 2100 | 10 | 25 | 0 | 1000 | 0 | 1000 | 10 | 2600 | 10 | — | — | 20 |
| 2 | 2100 | 60 | 25 | 0 | 900 | 0 | 900 | 10 | 2500 | 10 | — | — | 20 |
| 3 | 2100 | 20 | 25 | 0 | 800 | 0 | 800 | 10 | 2550 | 10 | — | — | 10 |
| 4 | 2100 | 5 | 25 | 0 | 800 | 0 | 800 | 10 | 2550 | 10 | — | — | 20 |
| 5 | 2100 | 5 | 25 | 0 | 500 | 0 | 500 | 10 | 2500 | 10 | — | — | 20 |
| 6 | 2100 | 20 | 25 | 0 | 25 | 5 | 1100 | 5 | 1100 | 10 | 2700 | 10 | 20 |
| 7 | 2100 | 20 | 25 | 0 | 0 | 10 | 2200 | 10 | — | — | — | — | 20 |
| 8 | 2100 | 240 | 25 | 0 | 900 | 0 | 900 | 10 | 2500 | 10 | — | — | 20 |
| 9 | 2100 | 2 | 25 | 0 | 900 | 0 | 900 | 10 | 2500 | 10 | — | — | 20 |
| 10 | 2100 | 120 | 25 | 0 | 900 | 0 | 900 | 10 | 2500 | 10 | — | — | 20 |
| 11 | 2100 | 2 | 25 | 0 | 25 | 6.5 | 2350 | 6.5 | — | — | — | — | 20 |
| 12 | 2100 | 20 | 25 | 0 | 1000 | 0 | 1000 | 7.5 | 2600 | 7.5 | — | — | 30 |

[Measurement]

The polycrystalline cubic boron nitride as each Sample was subjected to measurement of the cubic boron nitride content, the carbon content, the oxygen content, the total content of alkali metals and alkaline earth metals, and the heat conductivity of the polycrystalline cubic boron nitride, the dislocation density of cubic boron nitride, ratio I (220)/I (111) in the X-ray diffraction spectrum, the d50 and d90 of crystal grains, and the transverse rupture strength.

<Composition>

The cubic boron nitride content (% by volume) in the polycrystalline cubic boron nitride as each Sample was measured by an X-ray diffraction method. The specific measurement method is as shown in the first embodiment. The results are shown in the "cBN content" column of the "polycrystalline cubic boron nitride" in Table 2.

<Carbon Content, Oxygen Content, and Total Content of Alkali Metals and Alkaline Earth Metals>

The polycrystalline cubic boron nitride as each Sample was subjected to measurement of the carbon content, the oxygen content, and the total content of alkali metals and alkaline earth metals therein. The specific measurement methods are as shown in the first embodiment. The results are shown in the "carbon content", "oxygen content", and "alkali metal/alkaline earth metal content" columns of the "polycrystalline cubic boron nitride" in Table 2.

<Heat Conductivity>

The heat conductivity of the polycrystalline cubic boron nitride as each Sample was measured. The specific measurement method is as shown in the first embodiment. The results are shown in the "heat conductivity" column of the "polycrystalline cubic boron nitride" in Table 2.

<Dislocation Density>

In cubic boron nitride in each Sample, the dislocation density of the cubic boron nitride was measured. The specific measurement method is as shown in the first embodiment. The results are shown in the "dislocation density" column of the "polycrystalline cubic boron nitride" in Table 2.

<Ratio I (220)/I (111) in X-Ray Diffraction Spectrum>

Ratio I (220)/I (111) in the X-ray diffraction spectrum of the polycrystalline cubic boron nitride as each Sample was measured. The specific measurement method is as shown in the first embodiment. The results are shown in the "I (220)/I (111)" column of the "polycrystalline cubic boron nitride" in Table 2.

<d50 and d90 of Equivalent Circle Diameters of Crystal Grains>

The d50 and d90 of equivalent circle diameters of a plurality of crystal grains included in the polycrystalline cubic boron nitride as each Sample were measured. The specific measurement methods are as shown in the first embodiment. The results are shown in the "d50" and "d90" columns of the "crystal grains" of the "polycrystalline cubic boron nitride" in Table 2.

<Transverse Rupture Strength>

The transverse rupture strength of the polycrystalline cubic boron nitride as each Sample was measured. The measurement method is as follows. A test piece of 6 mm×3 mm×0.5 mm was cut out from the polycrystalline cubic boron nitride, and a three-point bending test was performed using a silicon carbide (SiC) jig. The test temperature was room temperature (25° C.) and the span length (distance between support points) was 4 mm. The three-point bending test, corresponding to a method basically according to a method for testing bending strength at room temperature of fine ceramics in JIS R1601:2008, was performed in a down-scaled manner because the size of the test piece was restricted. The results are shown in the "transverse rupture strength" column of the "polycrystalline cubic boron nitride" in Table 2.

TABLE 2

| | Polycrystalline cubic boron nitride | | | | | | | | | |
|---|---|---|---|---|---|---|---|---|---|---|
| | Crystal grains | | Heat | Dislocation | cBN | Carbon | Oxygen | Alkali metal/alkaline | | Transverse rupture |
| Sample No. | d50 μm | d90 μm | conductivity W/mK | density ×$10^{15}$/$m^2$ | content % by volume | content ppm | content ppm | earth metal content ppm | $I_{(220)}/I_{(111)}$ | strength GPa |
| 1 | 3.5 | 4.9 | 510 | 3.8 | 99.9 | 100 | 500 | 5 | 0.21 | 1.0 |
| 2 | 1.0 | 1.4 | 358 | 4.4 | 99.8 | 1000 | 500 | 4 | 0.13 | 1.0 |
| 3 | 0.9 | 1.2 | 305 | 4.7 | 99.9 | 300 | 500 | 8 | 0.23 | 1.1 |
| 4 | 0.9 | 1.2 | 295 | 4.6 | 99.9 | 80 | 900 | 8 | 0.20 | 0.7 |
| 5 | 0.6 | 0.7 | 265 | 5.1 | 99.9 | 80 | 800 | 13 | 0.22 | 0.8 |
| 6 | 9.0 | 11.0 | 700 | 3.1 | 99.9 | 300 | 500 | 7 | 0.28 | 1.0 |
| 7 | 0.2 | 0.3 | 190 | 8.1 | 99.8 | 300 | 500 | 7 | 0.22 | 1.5 |
| 8 | 0.7 | 0.9 | 289 | 4.8 | 99.4 | 5000 | 2000 | 20 | 0.22 | 0.8 |
| 9 | 1.0 | 1.3 | 350 | 4.5 | 99.9 | 50 | 500 | 8 | 0.21 | 0.7 |
| 10 | 1.0 | 1.4 | 350 | 4.5 | 99.7 | 2000 | 500 | 8 | 0.19 | 0.7 |
| 11 | 4.0 | 5.5 | 510 | 8.5 | 95.5 | 50 | 500 | 8 | 0.03 | 0.4 |
| 12 | 3.8 | 5.2 | 520 | 3.9 | 99.5 | 300 | 500 | 5 | 0.23 | 0.9 |

[Consideration]

The polycrystalline cubic boron nitride of each of Sample 1 to Sample 3, and Sample 6 and Sample 12 corresponds to the Example. The polycrystalline cubic boron nitride of each of Sample 4, Sample 5, and Sample 7 to Sample 11 corresponds to the Comparative Example. It was confirmed that the polycrystalline cubic boron nitrides of Sample 1 to Sample 3, Sample 6 and Sample 12 all had a heat conductivity of 300 W/mK or more, had a high heat conductivity and a transverse rupture strength of 0.9 GPa or more, and had high transverse rupture strength.

The polycrystalline cubic boron nitrides of Sample 4 and Sample 5 had lower heat conductivity and transverse rupture strength than the polycrystalline cubic boron nitride corresponding to the Example. It is presumed that this is because the carbon content is as low as 80 ppm and the bonding force between cBN particles is low.

The polycrystalline cubic boron nitride of Sample 7 had a lower heat conductivity than the polycrystalline cubic boron nitride corresponding to the Example. It is presumed that this is because the final sintering temperature in the sintering step is as low as 2200° C. and thus the grain size of the crystal grains is small. It is also presumed that this is because the entry temperature into the stable region of wurtzite boron nitride in the heating and pressurizing path is low (about 35° C.) and thus the dislocation density is high.

The polycrystalline cubic boron nitride of Sample 8 had lower heat conductivity and transverse rupture strength than the polycrystalline cubic boron nitride corresponding to the Example. It is presumed that this is because the carbon content is as excessive as 5000 ppm and carbon having low strength is excessively precipitated at the grain boundaries. It is also presumed that this is because the cBN content is as low as 99.4% by volume.

The polycrystalline cubic boron nitride of Sample 9 had lower transverse rupture strength than the polycrystalline cubic boron nitride corresponding to the Example. It is presumed that this is because the carbon content is as low as 50 ppm and the bonding force between cBN particles is low.

The polycrystalline cubic boron nitride of Sample 10 had lower transverse rupture strength than the polycrystalline cubic boron nitride corresponding to the Example. It is presumed that this is because the carbon content is as excessive as 2000 ppm and carbon having low strength is excessively precipitated at the grain boundaries.

The polycrystalline cubic boron nitride of Sample 11 had lower transverse rupture strength than the polycrystalline cubic boron nitride corresponding to the Example. The polycrystalline cubic boron nitride of Sample 11 had a cBN content of 95.5% by volume and a hexagonal boron nitride content of 4.5% by volume. It is thus presumed that the transverse rupture strength is lowered.

Although embodiments and Examples of the present disclosure have been described above, from the beginning it has been planned that various configurations of the above-described embodiments and Examples may be appropriately combined and variously modified.

The embodiments and Examples disclosed this time are to be considered as illustrative in all points and are not restrictive. The scope of the present disclosure is shown not by the embodiments and examples described above but by the claims, and it is intended meanings equivalent to the claims and all modifications are also included within the scope of the present disclosure.

The invention claimed is:

1. A polycrystalline cubic boron nitride comprising 99.5% by volume or more of cubic boron nitride, wherein
   the polycrystalline cubic boron nitride has a heat conductivity of 300 W/mK or more,
   the polycrystalline cubic boron nitride has a carbon content of 100 ppm or more and 1000 ppm or less in terms of mass,
   the polycrystalline cubic boron nitride comprises a plurality of crystal grains, and
   the plurality of crystal grains have a median diameter d50 of an equivalent circle diameter of 0.9 μm or more and 10 μm or less.

2. The polycrystalline cubic boron nitride according to claim 1, wherein the polycrystalline cubic boron nitride has a dislocation density of $4.5 \times 10^{15}/m^2$ or less.

3. The polycrystalline cubic boron nitride according to claim 1, wherein the polycrystalline cubic boron nitride has an oxygen content of 700 ppm or less in terms of mass.

4. The polycrystalline cubic boron nitride according to claim 1, wherein the polycrystalline cubic boron nitride has a total content of an alkali metal element and an alkaline earth metal element of 10 ppm or less in terms of mass.

5. The polycrystalline cubic boron nitride according to claim 1, wherein the polycrystalline cubic boron nitride has a heat conductivity of 500 W/mK or more.

6. The polycrystalline cubic boron nitride according to claim 1, wherein, in an X-ray diffraction spectrum of the polycrystalline cubic boron nitride, a ratio of an X-ray diffraction intensity I (220) of the (220) plane to an X-ray diffraction intensity I (111) of the (111) plane, I (220)/I (111), is 0.10 or more and 0.30 or less.

7. The polycrystalline cubic boron nitride according to claim 2, wherein the dislocation density is calculated by using a modified Williamson-Hall method and a modified Warren-Averbach method.

8. The polycrystalline cubic boron nitride according to claim 2, wherein the dislocation density is measured using synchrotron radiation as an X-ray source.

9. A heatsink using the polycrystalline cubic boron nitride according to claim 1.

* * * * *